United States Patent
Yang et al.

(10) Patent No.: US 12,259,661 B2
(45) Date of Patent: Mar. 25, 2025

(54) OVERLAY MARK, OVERLAY MARKING METHOD AND OVERLAY MEASURING METHOD

(71) Applicant: NEXCHIP SEMICONDUCTOR CORPORATION, Anhui (CN)

(72) Inventors: Kuotung Yang, Anhui (CN); Hui Liu, Anhui (CN); Ke Yuan, Anhui (CN)

(73) Assignee: NEXCHIP SEMICONDUCTOR CORPORATION, Hefei (CN)

( * ) Notice: Subject to any disclaimer, the term of this patent is extended or adjusted under 35 U.S.C. 154(b) by 923 days.

(21) Appl. No.: 17/377,201

(22) Filed: Jul. 15, 2021

(65) Prior Publication Data

US 2022/0082951 A1     Mar. 17, 2022

(30) Foreign Application Priority Data

Sep. 17, 2020   (CN) .......................... 202010979691.X (51) Int. Cl.
*G03F 7/00* (2006.01)
*H01L 21/66* (2006.01)

(52) U.S. Cl.
CPC ...... *G03F 7/70633* (2013.01); *G03F 7/70683* (2013.01); *H01L 22/12* (2013.01)

(58) Field of Classification Search
CPC .... G03F 7/70633; G03F 7/70683; G03F 1/42; G03F 9/7023; G03F 9/708; G03F 9/7088; H01L 22/12; H01L 22/30

USPC ............................................. 430/22; 257/797
See application file for complete search history.

(56) References Cited

U.S. PATENT DOCUMENTS

| | | | | |
|---|---|---|---|---|
| 5,532,091 A | * | 7/1996 | Mizutani | G03F 9/7084 356/399 |
| 2005/0276465 A1 | * | 12/2005 | Chen | G03F 7/70633 257/E23.179 |
| 2014/0185025 A1 | * | 7/2014 | Lin | G03F 9/7084 355/67 |
| 2015/0277227 A1 | * | 10/2015 | Guo | G03F 7/2022 428/201 |
| 2020/0388577 A1 | * | 12/2020 | Cheng | H01L 23/544 |

* cited by examiner

*Primary Examiner* — Caleen O Sullivan (57) ABSTRACT

The present disclosure discloses an overlay mark, an overlay marking method and an overlay measuring method. The overlay marking method includes at least: preparing a first material layer; preparing a first mark group on the first material layer, and the first mark group is a centrally symmetrical pattern; preparing a second material layer on the first material layer; preparing a second mark group corresponding to the first mark group on the second material layer, and the second mark group is a centrally symmetrical pattern; centers of symmetry of the second mark group and the first mark group are located on the same vertical line; preparing a third material layer on the second material layer; preparing a third mark group corresponding to the first mark group and the second mark group on the third material layer, and the third mark group is a centrally symmetrical pattern.

7 Claims, 6 Drawing Sheets

OVERLAY MARK, OVERLAY MARKING METHOD AND OVERLAY MEASURING METHOD

BACKGROUND

Field of Disclosure

The present disclosure relates to the technical field of semiconductors, in particular, to an overlay mark, an overlay marking method and an overlay measuring method.

Description of Related Arts

Overlay testing is a basic process in the photolithography process of semiconductor manufacturing, it is used to characterize the degree of stacking of two lithography levels. Overlay testing is realized by placing a specific test structure in a dicing groove, measuring by using an overlay tester, and finally determining whether the overlay is standard according to the measured value.

In modern integrated circuit manufacturing processes, it is usually necessary to have one photolithography level aligned with the previous two levels. Assuming that there are three photolithography levels in the semiconductor manufacturing process, and the first photolithography level, the second photolithography level and the third photolithography level are sequentially performed. The third photolithography level has stricter overlay specifications for the first photolithography level and the second photolithography level. For example, the third photolithography level is aligned with the first photolithography level and the second photolithography level. In order to ensure the accuracy of the overlay, after the photolithography of the third photolithography level, it is necessary to test the overlay of the third photolithography level to the second photolithography level, and the third photolithography level to the first photolithography level. This overlay method must be measured at least twice, which affects the production capacity and product circulation in the production line. In addition, with the diversification of products and the increase of photolithography levels, too many test marks occupy too many positions of the dicing slot, which wastes the structural space of the product.

SUMMARY

The present disclosure provides an overlay mark, an overlay marking method, and an overlay measuring method, which solves the problems that the existing three-layer overlay requires multiple masks, has poor alignment accuracy, and occupies too much structural space.

To solve the above technical problems, the present disclosure is realized to through the following technical solutions:

The present disclosure provides an overlay marking method, which includes: preparing a first material layer; preparing a first mark group on the first material layer, and the first mark group is a centrally symmetrical pattern; preparing a second material layer on the first material layer; preparing a second mark group corresponding to the first mark group on the second material layer, and the second mark group is a centrally symmetrical pattern; centers of symmetry of the second mark group and the first mark group are located on the same vertical line; preparing a third material layer on the second material layer; and preparing a third mark group corresponding to the first mark group and the second mark group on the third material layer, and the third mark group is a centrally symmetrical pattern; centers of symmetry of the third mark group and the second mark group and the first mark group are located on the same vertical line, setting directions of the three mark groups include a first direction and a second direction, the first direction is perpendicular to the second direction, and corresponding positions of two of the three mark groups are arranged side by side along the first direction or the second direction.

In an embodiment of the present disclosure, the first mark group includes at least four first sub-mark groups, and the four first sub-mark groups are respectively arranged along a first direction and a second direction, and the first direction is perpendicular to the second direction.

In an embodiment of the present disclosure, the second mark group includes at least four second sub-mark groups, and the four second sub-mark groups are respectively arranged along the first direction and the second direction, the second sub-mark groups arranged in the first direction correspond to the first sub-mark groups arranged in the first direction.

In an embodiment of the present disclosure, the third mark group includes at least four third sub-mark groups, and the four third sub-mark groups are respectively arranged along the first direction and the second direction, the third sub-mark groups arranged in the first direction correspond to the first sub-mark groups and the second sub-mark groups arranged in the first direction.

In an embodiment of the present disclosure, the two sub-mark groups arranged along the first direction are arranged side by side along the extension direction of the first direction.

In an embodiment of the present disclosure, the two sub-mark groups arranged along the second direction are arranged side by side along the extension direction of the second direction.

In an embodiment of the present disclosure, the first sub-mark group includes a plurality of first marks; the second sub-mark group includes a plurality of second marks; and the third sub-mark group includes a plurality of third marks.

In an embodiment of the present disclosure, numbers of the first marks, the second marks, and the third marks are the same, and lengths of the first mark and the second mark are smaller than a length of the third mark.

In an embodiment of the present disclosure, lengths of the first mark and the second mark are the same as the length of the third mark, and numbers of the first mark and the second mark are smaller than a number of the third mark.

In an embodiment of the present disclosure, when the first mark group, the second mark group, and the third mark group are projected on a same plane, the first mark group is located on an inner side of the second mark group and the third mark group.

The present disclosure further provides an overlay measuring method, which includes: preparing a first material layer; preparing a first mark group on the first material layer, and the first mark group is a centrally symmetrical pattern; preparing a second material layer on the first material layer; preparing a second mark group corresponding to the first mark group on the second material layer, and the second mark group is a centrally symmetrical pattern; centers of symmetry of the second mark group and the first mark group are located on the same vertical line; preparing a third material layer on the second material layer; preparing a third mark group corresponding to the first mark group and the second mark group on the third material layer, and the third mark group is a centrally symmetrical pattern; centers of symmetry of the third mark group and the second mark group and the first mark group are located on the same vertical line, setting directions of the three mark groups include a first direction and a second direction, the first direction is perpendicular to the second direction, and corresponding positions of two of the three mark groups are arranged side by side along the first direction or the second direction; obtaining displacement values of the first mark group, the second mark group, and the third mark group; and determining whether the first material layer, the second material layer and the third material layer are aligned according to the displacement values.

The present disclosure further provides an overlay mark, which includes: a first mark group prepared on a first material layer, and the first mark group is a centrally symmetrical pattern; a second mark group prepared on a second material layer, the second mark group is arranged corresponding to the first mark group, and the second mark group is a centrally symmetrical pattern; and a third mark group prepared on a third material layer, the third mark group corresponds to the first mark group and the second mark group, and the third mark group is a centrally symmetrical pattern; centers of symmetry of the first mark group, the second mark group, and the third mark group are located on the same vertical line, setting directions of the three mark groups include a first direction and a second direction, the first direction is perpendicular to the second direction, and corresponding positions of two of the three mark groups are arranged side by side along the first direction or the second direction.

The overlay mark, overlay marking method, and overlay measuring method of the present disclosure can reduce the number of overlay measurements, save the capacity of overlay devices, speed up product circulation in the production line, and reduce the number of overlay templates placed in the dicing groove. The space of the dicing groove is saved, and the space utilization rate of the product is improved. At the same time, the overlay mark, overlay marking method and overlay measuring method of the present disclosure can greatly improve the alignment accuracy of the three-layer photolithography layer.

Any product implementing the present disclosure does not necessarily need to achieve all the advantages described above at the same time.

BRIEF DESCRIPTION OF THE DRAWINGS

In order to explain the technical solutions of the embodiments of the present disclosure more clearly, the following will briefly introduce the drawings used in the description of the embodiments. The drawings in the following description are only some embodiments of the present disclosure. For those of ordinary skill in the art, other drawings can be obtained from these drawings without creative work.

REFERENCE NUMBERS

1 First material layer; 2 Second material layer; 3 Third material layer; 10 First mark group; 20 Second mark group; 30 Third mark group; 11 First sub-mark group; 12 First mark; 21 Second sub-mark group; 22 Second mark; 31 Third sub-mark group; 32 Third mark.

DETAILED DESCRIPTION OF THE PREFERRED EMBODIMENTS

The technical solutions in the embodiments of the present disclosure will be described clearly and completely below with reference to the drawings. The described embodiments are only a part of the embodiments of the present disclosure, and will not be limited. Based on the embodiments in the present disclosure, all other embodiments obtained by a person skilled in the art fall within the protection scope of the present disclosure.

In modern integrated circuit manufacturing processes, it is usually necessary to have one photolithography level aligned with the previous two levels. Assuming that there are three photolithography levels in the semiconductor manufacturing process, and the first photolithography level, the second photolithography level and the third photolithography level are sequentially performed. After the photolithography of the third photolithography level, it is necessary to test whether the three photolithography levels are aligned.

Referring to FIGS. 1 to 4, the present disclosure provides an overlay mark, which includes: a first mark group 10, a second mark group 20, and a third mark group 30.

Referring to FIGS. 1 to 4, the first mark group 10 is formed on a first material layer 1, and the first mark group 10 is a centrally symmetrical pattern. In this embodiment, the first material layer 1 may include an interconnection metal layer of metals such as aluminum and copper used to make metal wiring. The first material layer 1 may also be a gate material layer including, for example, polysilicon, metal (such as aluminum), etc. In some embodiments, the first material layer 1 may further include an interlayer dielectric layer such as silicon dioxide, a low dielectric constant material, etc. In some embodiments, the first material layer 1 may be a semiconductor substrate, for example. For example, in the case of performing a photolithography process operation for defining an active region, it is necessary to form the first mark group 10 of overlay deviation check marks on the semiconductor substrate. The first mark group 10 includes, for example, at least four first sub-mark groups 11, and the four first sub-mark groups 11 are respectively arranged along a first direction and a second direction, and the first direction is perpendicular to the second direction. The first sub-mark group 11 includes a plurality of first marks 12, and the plurality of first marks 12 are strip-shaped and parallel to each other. The surface of the first mark 12 may include a concave-convex structure. The lengths of the plurality of the first marks 12 may be the same or different, and the present disclosure is not limited. The distance between the plurality of first marks 12 is, for example, 0.5-2.1 um, and the line width is, for example, 0.8-2.1 um.

Referring to FIGS. 1 to 4, the second mark group 20 is formed on the second material layer 2, and the second mark group 20 is arranged corresponding to the first mark group 10. The second mark group 20 is a centrally symmetrical pattern. In some embodiments, the second mark group 20 includes, for example, at least four second sub-mark groups 21, and the four second sub-mark groups 21 are respectively arranged along the first direction and the second direction. The second sub-mark groups 21 arranged in the first direction correspond to the first sub-mark groups 11 arranged in the first direction. In some embodiments, the first sub-mark groups 11 and the second sub-mark groups 21 arranged along the first direction are arranged side by side along the extension direction of the first direction. The first sub-mark groups 11 and the second sub-mark groups 21 arranged along the second direction are arranged side by side along the extension direction of the second direction. The second sub-mark group 21 includes a plurality of second marks 22, and the plurality of second marks 22 are strip-shaped and parallel to each other. The surface of the second mark 22 may include a concave-convex structure. The lengths of the plurality of the second marks 22 may be the same or different, and the present disclosure is not limited. The length of the second mark 22 may be the same as the length of the first mark 12, or may be different from the length of the first mark 12, which is also not limited. The distance between the plurality of second marks 22 is, for example, 0.5-2.1 um, and the line width is, for example, 0.8-2.1 um.

Referring to FIGS. 1 to 4, the third mark group 30 is formed on the third material layer 3, and corresponds to the first mark group 10 and the second mark group 20. The third mark group 30 is a centrally symmetrical pattern. The third mark group 30 includes at least four third sub-mark groups 31, and the four third sub-mark groups 31 are respectively arranged along the first direction and the second direction. The third sub-mark groups 31 arranged in the first direction correspond to the first sub-mark groups 11 and the second sub-mark groups 21 arranged in the first direction. The third sub-mark group 31 includes a plurality of third marks 32, and the plurality of third marks 32 are strip-shaped and parallel to each other. The surface of the third mark 32 may include a concave-convex structure. The lengths of the plurality of the third marks 32 may be the same or different, and the present disclosure is not limited. The length of the third mark 32 may be the same as the length of the first mark 12 and the second mark 22, or may be different from the length of the first mark 12 and the second mark 22, which is also not limited. The distance between the plurality of third marks 32 is, for example, 0.5-2.1 um, and the line width is, for example, 0.8-2.1 um. In some embodiments, the number of the first mark 12, the second mark 22, and the third mark 32 are the same, and the length of the first mark 12 and the second mark 22 is smaller than that of the third mark 32. In other embodiments, the lengths of the first mark 12 and the second mark 22 are the same as the length of the third mark 32, and the number of the first mark 12 and the second mark 22 is smaller than the number of the third mark 32. When the first mark group 10, the second mark group 20, and the third mark group 30 are projected on the same plane, the first mark group 10 is located on the inner side of the second mark group 20 and the third mark group 30.

Referring to FIGS. 1 to 4, the centers of symmetry of the first mark group 10, the second mark group 20, and the third mark group 30 are located on the same vertical line. The first mark group 10, the second mark group 20, and the third mark group 30 have no specified overlapping sequence. The first mark group 10, the second mark group 20, and the third mark group 30 can be arranged arbitrarily in the projection pattern. The setting directions of the three mark groups include a first direction and a second direction. The first direction is perpendicular to the second direction. The corresponding positions of two of the three mark groups are arranged side by side along the first direction or the second direction.

Figure 1:
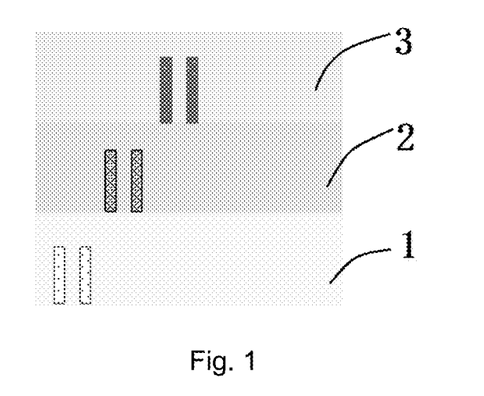
FIG. 1 shows a side view of an overlay mark according to the present disclosure.
Figure 2:
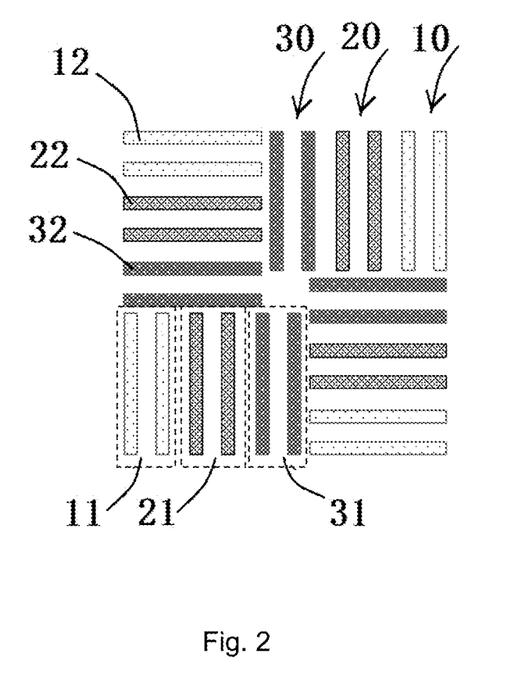
FIG. 2 shows a top view of the overlay mark according to an embodiment of the present disclosure.
Figure 3:
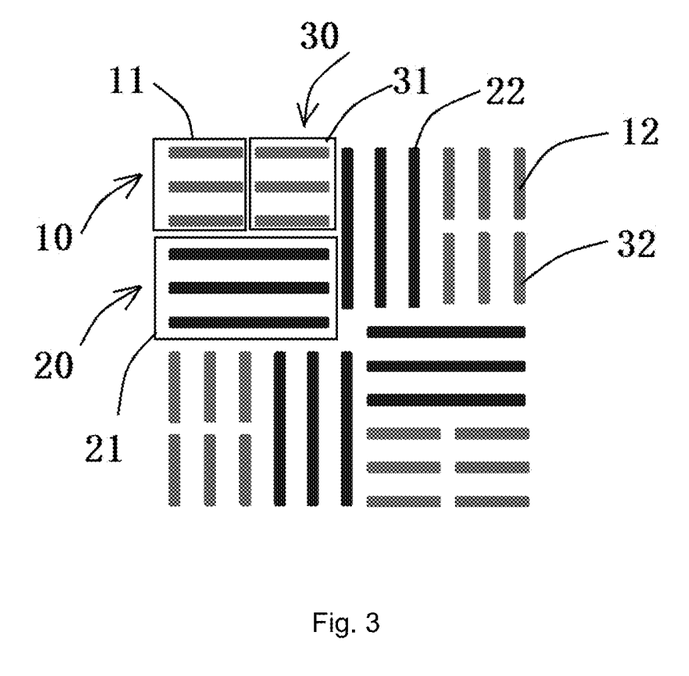
FIG. 3 shows a top view of the overlay mark according to another embodiment of the present disclosure.
Figure 4:
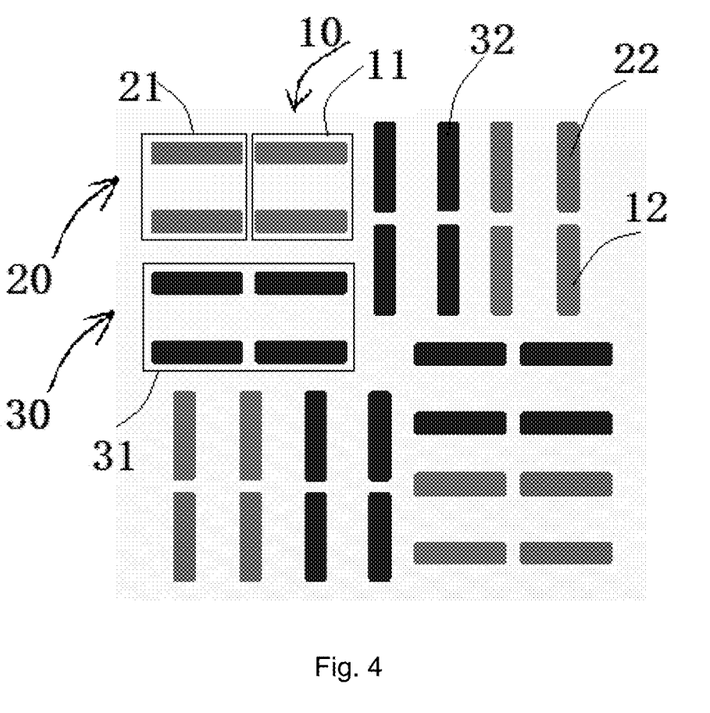
FIG. 4 shows a top view of the overlay mark according to another embodiment of the present disclosure.
Figure 5:
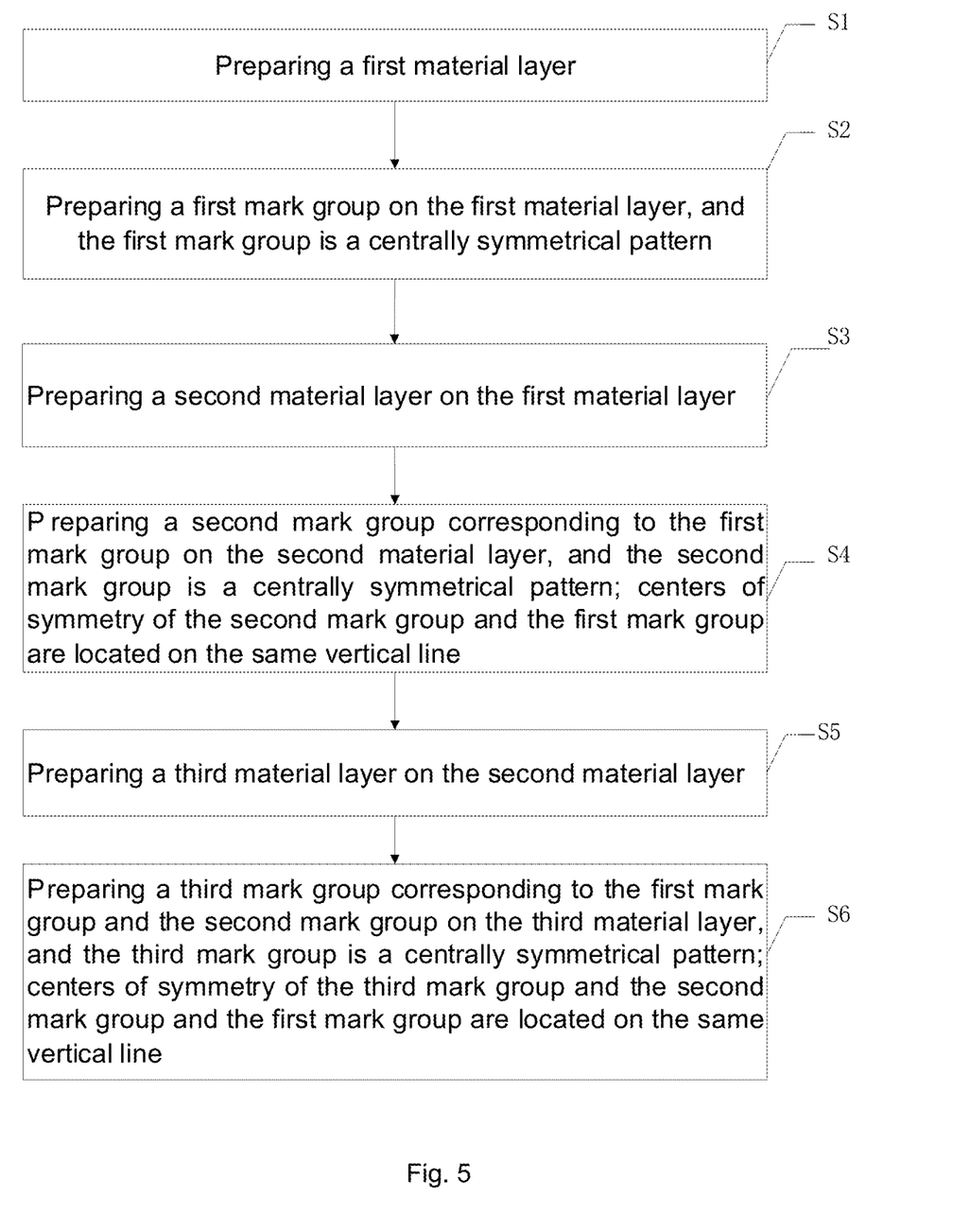
FIG. 5 shows a flow chart of an overlay marking method according to the present disclosure.

Referring to FIG. 5, the present disclosure provides an overlay marking method, which includes at least:

S1. Preparing a first material layer 1.
S2. Preparing a first mark group 10 on the first material layer 1, and the first mark group 10 is a centrally symmetrical pattern.
S3. Preparing a second material layer 2 on the first material layer 1.
S4. Preparing a second mark group 20 corresponding to the first mark group 10 on the second material layer 2, and the second mark group 20 is a centrally symmetrical pattern; centers of symmetry of the second mark group 20 and the first mark group 10 are located on the same vertical line.
S5. Preparing a third material layer 3 on the second material layer 2.
S6. Preparing a third mark group 30 corresponding to the first mark group 10 and the second mark group 20 on the third material layer 3, and the third mark group 30 is a centrally symmetrical pattern; centers of symmetry of the third mark group 30 and the second mark group 20 and the first mark group 10 are located on the same vertical line, the setting directions of the three mark groups include a first direction and a second direction, the first direction is perpendicular to the second direction, and the corresponding positions of two of the three mark groups are arranged side by side along the first direction or the second direction.

Referring to FIG. 5, first, in operation S1, the first material layer 1 is prepared. In this embodiment, the first material layer 1 may include an interconnection metal layer of metals such as aluminum and copper used to make metal wiring, it may also be a gate material layer including, for example, polysilicon, metal (such as aluminum), etc. In some embodiments, the first material layer 1 may further include an interlayer dielectric layer such as silicon dioxide, a low dielectric constant material, etc. In some embodiments, the first material layer 1 may be a semiconductor substrate, for example.

Referring to FIG. 5, in operation S2, the first mark group 10 is prepared on the first material layer 1, and the first mark group 10 is a centrally symmetrical pattern. In this embodiment, the method of forming the first mark group 10 on the first material layer 1 includes: spin-coating a first photoresist on the first material layer 1, and transferring a pattern of the first mark group 10 on a first mask to a first photoresist layer through exposure and development to define the pattern of the first mark group 10. In this embodiment, when the pattern of the first mark group 10 on the first mask is transferred to the first photoresist layer by exposure and development, the circuit device structure pattern on the first mask is also transferred to the first photoresist layer that covers the first material layer 1. The first material layer 1 is etched by using the first photoresist layer as a mask to transfer the pattern of the first mark group 10 on the first photoresist layer to the first material layer 1, so that the first mark group 10 is prepared on the first material layer 1. In this embodiment, the first photoresist layer presenting the circuit device structure pattern is used as a mask to etch the area on the first material layer 1 other than the area covered by the photoresist. After the etching process is completed, the circuit device structure pattern presented on the first photoresist that covers the first material layer 1 is transferred to the first material layer 1, and the first mark group 10 is also transferred to the first material layer 1. The first mark group 10 includes, for example, four first sub-mark groups 11, and the four first sub-mark groups 11 are respectively arranged along a first direction and a second direction, and the first direction is perpendicular to the second direction. The first sub-mark group 11 includes a plurality of first marks 12, and the plurality of first marks 12 are strip-shaped and parallel to each other. The surface of the first mark 12 may include a concave-convex structure. The lengths of the plurality of first marks 12 may be the same or different, and the present disclosure is not limited. The distance between the plurality of first marks 12 is, for example, 0.5-2.1 um, and the line width is, for example, 0.8-2.1 um.

Referring to FIG. 5, in operation S3, the second material layer 2 is formed on the first material layer 1. In this embodiment, the first material layer 1 and the second material layer 2 can be any two material layers on which patterns need to be formed by photolithography and etching processes throughout the semiconductor manufacturing process. Between the first material layer 1 and the second material layer 2, other dielectric thin film layers, conductive metal layers, etc. may be deposited. For example, when the first material layer 1 is a semiconductor substrate, the second material layer 2 may be a stacked layer including a polysilicon gate layer and a gate insulating layer. In this embodiment, after the first material layer 1 is prepared, the second material layer 2 may be prepared by a chemical vapor deposition process or a plasma enhanced chemical vapor deposition process or the like.

Referring to FIG. 5, in operation S4, the second mark group 20 corresponding to the first mark group 10 is prepared on the second material layer 2, and the second mark group 20 is a centrally symmetrical pattern, centers of symmetry of the second mark group 20 and the first mark group 10 are located on the same vertical line. In this embodiment, the method of preparing the second mark group 20 on the second material layer 2 includes: spin-coating a second photoresist on the second material layer 2, and transferring a pattern of the second mark group 20 on a second mask to a second photoresist layer through exposure and development to define the pattern of the second mark group 20. In this embodiment, when the pattern of the second mark group 20 on the second mask is transferred to the second photoresist layer by exposure and development, the circuit device structure pattern on the second mask is also transferred to the second photoresist layer that covers the second material layer 2. The second material layer 2 is etched by using the second photoresist layer as a mask to transfer the pattern of the second mark group 20 on the second photoresist layer to the second material layer 2, so that the second mark group 20 is prepared on the second material layer 2. In this embodiment, the second photoresist presenting the circuit device structure pattern is used as a mask to etch the area on the second material layer 2 other than the area covered by the photoresist. After the etching process is completed, the circuit device structure pattern presented on the second photoresist that covers the second material layer 2 is transferred to the second material layer 2, and the second mark group 20 is also transferred to the second material layer 2. In some embodiments, the second mark group 20 includes, for example, at least four second sub-mark groups 21, and the four second sub-mark groups 21 are respectively arranged along the first direction and the second direction. The second sub-mark groups 21 arranged in the first direction correspond to the first sub-mark groups 11 arranged in the first direction. In some embodiments, the first sub-mark groups 11 and the second sub-mark groups 21 arranged along the first direction are arranged side by side along the extension direction of the first direction. The first sub-mark groups 11 and the second sub-mark groups 21 arranged along the second direction are arranged side by side along the extension direction of the second direction. The second sub-mark group 21 includes a plurality of second marks 22, and the plurality of second marks 22 are strip-shaped and parallel to each other. The surface of the second mark 22 may include a concave-convex structure. The lengths of the plurality of second marks 22 may be the same or different, and the present disclosure is not limited. The length of the second mark 22 may be the same as the length of the first mark 12, or may be different from the length of the first mark 12, which is also not limited. The distance between the plurality of second marks 22 is, for example, 0.5-2.1 um, and the line width is, for example, 0.8-2.1 um.

Referring to FIG. 5, in operation S5, the third material layer 3 is prepared on the second material layer 2. In this embodiment, the third material layer 3 can be any material layer on which patterns need to be formed by photolithography and etching processes throughout the semiconductor manufacturing process. Between the second material layer 2 and the third material layer 3, other dielectric thin film layers, conductive metal layers, etc. can also be deposited. In this embodiment, after the second material layer 2 is prepared, the third material layer 3 may be prepared by a chemical vapor deposition process or a plasma enhanced chemical vapor deposition process or the like.

Referring to FIG. 5, in operation S6, the third mark group 30 corresponding to the first mark group 10 and the second mark group 20 is prepared on the third material layer 3, and the third mark group 30 is a centrally symmetrical pattern, centers of symmetry of the third mark group 30 and the second mark group 20 and the first mark group 10 are located on the same vertical line. The second mark group 20 corresponding to the first mark group 10 is prepared on the second material layer 2, and the second mark group 20 is a centrally symmetrical pattern. In this embodiment, the method for preparing the third mark group 30 on the third material layer 3 is the same as the method for preparing the first mark group 10 and the second mark group 20, and will not be repeated here. The setting directions of the three mark groups include a first direction and a second direction, the first direction is perpendicular to the second direction, and the corresponding positions of two of the three mark groups are arranged side by side along the first direction or the second direction. In this embodiment, the third mark group 30 includes four third sub-mark groups 31, and the four third sub-mark groups 31 are respectively arranged along the first direction and the second direction. The third sub-mark groups 31 arranged along the first direction correspond to the first sub-mark groups 11 and the second sub-mark groups 21 arranged along the first direction. The third sub-mark group 31 includes a plurality of third marks 32, and the plurality of third marks 32 are strip-shaped and parallel to each other. The surface of the third mark 32 may include a concave-convex structure. The lengths of the plurality of third marks 32 may be the same or different, and the present disclosure is not limited. The length of the third mark 32 may be the same as the length of the first mark 12 and the second mark 22, or may be different from the length of the first mark 12 and the second mark 22, which is also not limited. The distance between the plurality of third marks 32 is, for example, 0.5-2.1 um, and the line width is, for example, 0.8-2.1 um. In some embodiments, the number of the first mark 12, the second mark 22, and the third mark 32 are the same, and the length of the first mark 12 and the second mark 22 is smaller than that of the third mark 32. In other embodiments, the lengths of the first mark 12 and the second mark 22 are the same as the length of the third mark 32, and the number of the first mark 12 and the second mark 22 is smaller than the number of the third mark 32. When the first mark group 10, the second mark group 20, and the third mark group 30 are projected on the same plane, the first mark group 10 is located on the inner side of the second mark group 20 and the third mark group 30.

Referring to FIG. 5, the present disclosure provides an overlay marking method, which includes at least:

T1. Preparing a first material layer 1.

T2. Preparing a first mark group 10 on the first material layer 1, and the first mark group 10 is a centrally symmetrical pattern.

T3. Preparing a second material layer 2 on the first material layer 1.

T4. Preparing a second mark group 20 corresponding to the first mark group 10 on the second material layer 2, and the second mark group 20 is a centrally symmetrical pattern; centers of symmetry of the second mark group 20 and the first mark group 10 are located on the same vertical line.

T5. Preparing a third material layer 3 on the second material layer 2.

T6. Preparing a third mark group 30 corresponding to the first mark group 10 and the second mark group 20 on the third material layer 3, and the third mark group 30 is a centrally symmetrical pattern; centers of symmetry of the third mark group 30 and the second mark group 20 and the first mark group 10 are located on the same vertical line.

T7. Obtaining displacement values of the first mark group 10, the second mark group 20, and the third mark group 30.

T8. Determining whether the first material layer 1, the second material layer 2 and the third material layer 3 are aligned according to the displacement values.

Figure 6:
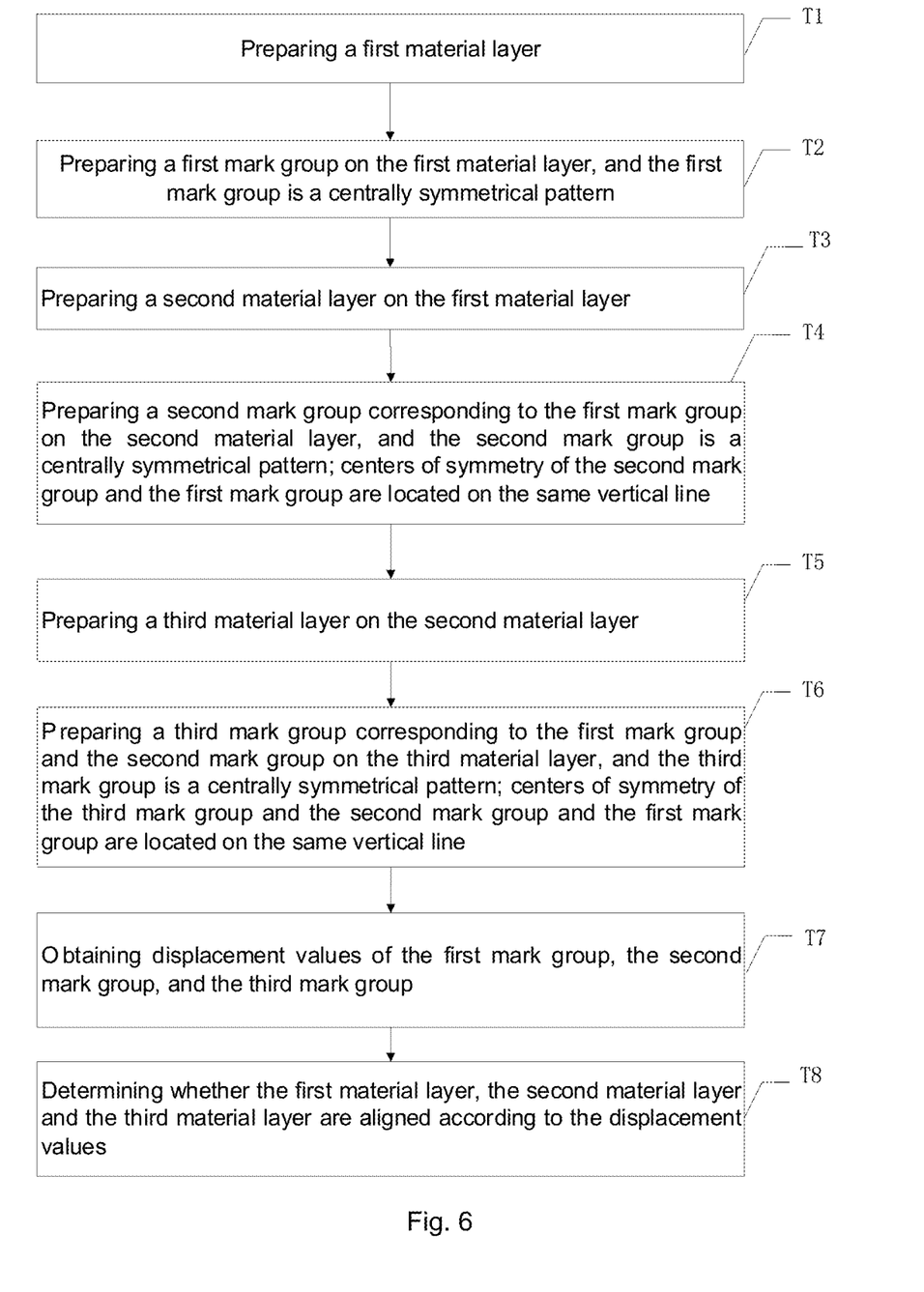
FIG. 6 shows a flow chart of an overlay measuring method according to the present disclosure.

Referring to FIG. 6, in operations T1 to T6, the overlay mark method of the present disclosure is used to prepare the overlay mark. The specific preparing method is as described above and will not be repeated here.

Figure 7:
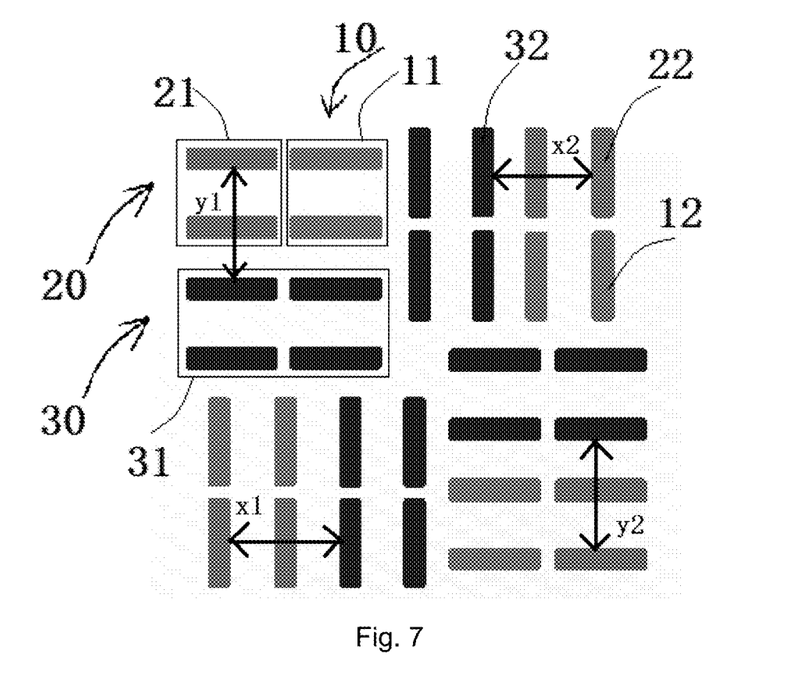
FIG. 7 shows a schematic view of the overlay measuring method of FIG. 6.

Referring to FIGS. 6 and 7, in operations T7 and T8, displacement values of the first mark group 10, the second mark group 20, and the third mark group 30 are obtained. In this embodiment, during the overlay alignment operation, the first mark group 10 of the first material layer 1, the second mark group 20 of the second material layer 2, and the third mark group 30 of the third material layer 3 can be simultaneously measured by the measuring device to determine the overlay deviation between the three material layers.

Specifically, the measuring device measures and obtains, for example, the overlay mark position on the first material layer 1 and the overlay mark position on the second material layer 2, the overlay mark position on the second material layer 2 and the overlay mark position on the third material layer 3, and the overlay mark position on the third material layer 3 and the overlay mark position on the first material layer 1. The overlay deviation of the first material layer 1 and the second material layer 2, the overlay deviation of the second material layer 2 and the third material layer 3, and the overlay deviation of the third material layer 3 and the first material layer 1 are determined by calculating the differences between the overlay mark positions corresponding to two material layers.

Exemplarily, a specific overlay mark obtained by using the overlay marking method in the embodiment of the present disclosure is shown in FIG. 7. It can be seen from the figure that the overlay marks are divided into four groups, for example, marked as group A, group B, group C and group D. All the marks in the group A and the group D are arranged along the first direction, all the marks in the group B and the group C are arranged along the second direction. In this embodiment, the group A, for example, includes four third marks 32, two second marks 22, and two first marks 12, and the lengths of the third mark 32, the first mark 12, and the second mark 22 are the same.

In this embodiment, for example, a specific method to calculate the overlay deviation between the third material layer 3 and the second material layer 2 includes: measuring a displacement difference y1 between a third mark 32 and a second mark 22 in group A, measuring a displacement difference y2 between a third mark 32 and a second mark 22 in group D, where the third mark 32 of the group A is symmetrical with the third mark 32 of the group D, and the second mark 22 of the group A is symmetrical with the second mark 22 of the group D. If y1=y2, it indicates that there is no deviation between the third mark 32 and the second mark 22 in the first direction. Measuring a displacement difference x2 between a third mark 32 and a second mark 22 in group B, measuring a displacement difference x1 between a third mark 32 and a second mark 22 in group C, where the third mark 32 of the group B is symmetrical with the third mark 32 of the group C, and the second mark 22 of the group B is symmetrical with the second mark 22 of the group C. If x1=x2, it indicates that there is no deviation between the third mark 32 and the second mark 22 in the second direction. When the deviation values of the third mark 32 and the second mark 22 in the first direction and the second direction are zero at the same time, it indicates that the third material layer 3 is aligned with the second material layer 2 without deviation. Similarly, the same method can be used to determine whether the third material layer 3 is aligned with the first material layer 1, and the second material layer 2 is aligned with the first material layer 1. If x1≠x2 or/and y1≠y2, the offset orientation and offset between the material layers can be determined accordingly.

The overlay mark, overlay marking method and overlay measuring method of the present disclosure can reduce the number of overlay measurements, save the capacity of overlay devices, speed up product circulation in the production line, and reduce the number of overlay templates placed in the dicing groove. The space of the dicing groove is saved, and the space utilization rate of the product is improved. At the same time, the overlay mark, overlay marking method and overlay measuring method of the present disclosure can greatly improve the alignment accuracy of the three-layer photolithography layer.

In the description of this specification, the description with reference to the terms "an embodiment", "example", "specific example", etc. means that the specific feature, structure, material or characteristic described in combination with the embodiment or example is included in at least one embodiment or example of the present disclosure. In this specification, the schematic representation of the above-mentioned terms does not necessarily refer to the same embodiment or example. Moreover, the described specific feature, structure, material or to characteristic may be combined in any one or more embodiments or examples in a suitable manner.

The selected embodiments of the present disclosure disclosed above are only used to help explain the present disclosure. The preferred embodiments do not describe all the details in detail, nor do they limit the disclosure to only the described specific embodiments. Many modifications and changes can be made according to the content of this specification. This specification selects and specifically describes these embodiments to better explain the principles and practical applications of the present disclosure, so that those skilled in the art can understand and use the present disclosure well. The present disclosure is only limited by the claims and their full scope and equivalents.

We claim:

1. An overlay marking method, comprising:
preparing a first material layer;
preparing a first mark group on the first material layer, and the first mark group is a centrally symmetrical pattern;
preparing a second material layer on the first material layer;
preparing a second mark group corresponding to the first mark group on the second material layer, and the second mark group is a centrally symmetrical pattern; centers of symmetry of the second mark group and the first mark group are located on the same vertical line;
preparing a third material layer on the second material layer; and
preparing a third mark group corresponding to the first mark group and the second mark group on the third material layer, and the third mark group is a centrally symmetrical pattern; centers of symmetry of the third mark group and the second mark group and the first mark group are located on the same vertical line, setting directions of the three mark groups include a first direction and a second direction, the first direction is perpendicular to the second direction, and corresponding positions of two of the three mark groups are arranged side by side along the first direction or the the second direction;
wherein the first mark group comprises at least four first sub-mark groups each comprising a plurality of first marks, the second mark group comprises at least four second sub-mark groups each comprising a plurality of second marks, the third mark group comprises at least four third sub-mark groups each comprising a plurality of third marks; and
wherein numbers of the first marks, the second marks, and the third marks are the same, and lengths of each first mark and each second mark are smaller than length of each third mark, or
the lengths of each first mark and each second mark are the same as the length of each third mark, and numbers of the first marks and the second marks are smaller than a number of the third marks.

2. The overlay marking method according to claim 1, wherein the four first sub-mark groups are respectively arranged along the first direction and the second direction.

3. The overlay marking method according to claim 2, wherein the four second sub-mark groups are respectively arranged along the first direction and the second direction, the second sub-mark groups arranged in the first direction correspond to the first sub-mark groups arranged in the first direction.

4. The overlay marking method according to claim 3, wherein the four third sub-mark groups are respectively arranged along the first direction and the second direction, the third sub-mark groups arranged in the first direction correspond to the first sub-mark groups and the second sub-mark groups arranged in the first direction.

5. The overlay marking method according to claim 1, wherein when the first mark group, the second mark group, and the third mark group are projected on a same plane, the first mark group is located on an inner side of the second mark group and the third mark group.

6. An overlay measuring method, comprising:
preparing a first material layer;
preparing a first mark group on the first material layer, and the first mark group is a centrally symmetrical pattern;
preparing a second material layer on the first material layer;
preparing a second mark group corresponding to the first mark group on the second material layer, and the second mark group is a centrally symmetrical pattern; centers of symmetry of the second mark group and the first mark group are located on the same vertical line;
preparing a third material layer on the second material layer;
preparing a third mark group corresponding to the first mark group and the second mark group on the third material layer, and the third mark group is a centrally symmetrical pattern; centers of symmetry of the third mark group and the second mark group and the first mark group are located on the same vertical line, setting directions of the three mark groups include a first direction and a second direction, the first direction is perpendicular to the second direction, and corresponding positions of two of the three mark groups are arranged side by side along the first direction or the second direction;
wherein the first mark group comprises at least four first sub-mark groups each comprising a plurality of first marks, the second mark group comprises at least four second sub-mark groups each comprising a plurality of second marks, the third mark group comprises at least four third sub-mark groups each comprising a plurality of third marks; and
wherein numbers of the first marks, the second marks, and the third marks are the same, and lengths of each first mark and each second mark are smaller than a length of each third mark, or
the lengths of each first mark and each second mark are the same as the length of each third mark, and numbers of the first marks and the second marks are smaller than a mumber of the third marks;
obtaining displacement values of the first mark group, the second mark group, and the third mark group; and
determining whether the first material layer, the second material layer and the third material layer are aligned according to the displacement values.

7. An overlay mark, comprising:
a first mark group prepared on a first material layer, and the first mark group is a centrally symmetrical pattern;
a second mark group prepared on a second material layer, the second mark group is arranged corresponding to the first mark group, and the second mark group is a centrally symmetrical pattern; and
a third mark group prepared on a third material layer, the third mark group corresponds to the first mark group and the second mark group, and the third mark group is a centrally symmetrical pattern;
wherein centers of symmetry of the first mark group, the second mark group, and the third mark group are located on the same vertical line, setting directions of the three mark groups include a first direction and a second direction, the first direction is perpendicular to the second direction, and corresponding positions of two of the three mark groups are arranged side by side along the first direction or the second direction;

wherein the first mark group comprises at least four first sub-mark groups each comprising a plurality of first marks, the second mark group comprises at least four second sub-mark groups each comprising a plurality of second marks, the third mark group comprises at least four third sub-mark groups each comprising a plurality of third marks; and wherein numbers of the first marks, the second marks, and the third marks are the same, and lengths of each first mark and each second mark are smaller than a length of each third mark, or the lengths of each first mark and each second mark are the same as the length of each third mark, and numbers of the first marks and the second marks are smaller than a number of the third marks.

* * * * *